(12) United States Patent
Dean et al.

(10) Patent No.: US 6,887,574 B2
(45) Date of Patent: May 3, 2005

(54) CURABLE FLAME RETARDANT EPOXY COMPOSITIONS

(75) Inventors: Jennifer M. Dean, JW Eindhoven (NL); Frank S. Bates, St. Louis Park, MN (US); Ha Q. Pham, Lake Jackson, TX (US); Nikhil E. Verghese, Lake Jackson, TX (US)

(73) Assignees: Dow Global Technologies Inc., Midland, MI (US); Regents of the University of Minnesota, Minneapolis, MN (US)

(*) Notice: Subject to any disclaimer, the term of this patent is extended or adjusted under 35 U.S.C. 154(b) by 26 days.

(21) Appl. No.: 10/456,128

(22) Filed: Jun. 6, 2003

(65) Prior Publication Data

US 2004/0247881 A1 Dec. 9, 2004

(51) Int. Cl.$^7$ .................... B32B 27/38; B32B 27/04; B32B 15/08; C08L 53/00; C08L 63/00
(52) U.S. Cl. ................. 428/416; 428/413; 428/414; 428/418; 428/297.4; 428/396; 428/901; 525/88; 525/92 H; 525/107; 525/109; 525/115; 525/529
(58) Field of Search ................. 428/413, 414, 428/415, 416, 417, 418, 297.7, 375, 396, 901, 297.4; 525/88, 90, 92 R, 92 H, 107, 109, 115, 523, 529; 523/400, 440

(56) References Cited

U.S. PATENT DOCUMENTS

| | | | |
|---|---|---|---|
| 3,686,359 A | 8/1972 | Soldatos et al. | 260/836 |
| 4,066,628 A | 1/1978 | Ashida et al. | 260/77.5 |
| 4,594,291 A | 6/1986 | Bertram et al. | 428/414 |
| 4,902,732 A | 2/1990 | Itoh et al. | 525/433 |
| 4,925,901 A | 5/1990 | Bertram et al. | 525/482 |
| 5,376,453 A | 12/1994 | von Gentzkow et al. | 428/415 |
| 5,476,908 A | 12/1995 | Kishi et al. | 525/393 |
| 6,403,220 B1 | 6/2002 | Brennan et al. | 428/413 |
| 6,610,765 B1 * | 8/2003 | Pfaendner et al. | 524/108 |
| 6,613,839 B1 | 9/2003 | Gan et al. | 525/117 |
| 2002/0119317 A1 | 8/2002 | Gan et al. | 428/413 |
| 2003/0059906 A1 * | 3/2003 | Hubbell et al. | 435/135 |

FOREIGN PATENT DOCUMENTS

| | | |
|---|---|---|
| JP | 05311070 | 11/1993 |
| WO | WO 99/00451 | 1/1999 |
| WO | WO 01/92415 | 12/2001 |

OTHER PUBLICATIONS

Dean, et al., "Micellar Structure and Mechanical Properties of Block Copolyer–Modified Epoxies," J.Polym. Sci. Part B Polymer Physics, 2001, 39, 2996–3010.
Grubbs, et al., "Reactive Block Copolymers for Modification of Thermosetting Epoxy," Macromolecules, 33, pp. 9522–9534 (2000).
Grubbs, et al., "Methacrylate Block Copolymers through Metal–Mediated living Free–Radical Polymerization for Modification of Thermosetting Epoxy," Macromolecules, 34, 8593 (2001), pp. 8593–8595.
Hillmyer, et al., "Synthesis and Characterization of Model Polyalkane–Poly(ethyleneoxide) Block Copolymers," Macromolecules, 29, 6994 (1996), pp. 6994–7002.
Ritzenthaler, et al., "ABC Triblock Copolymers/Epoxy–Diamine Blends. 1. Keys to Achieve Nanostructured Thermosets," Macromolecules 2002, 35, pp. 6245–6254.
Khandpur, et al., "Transmission Electron Microscopy of Saturated Hydrocarbon Block Copolymers," Journal of Polymer Science: Part B; Polymer Physics, 1995, 33, pp. 247–252.
Pearson, et al., "Toughening Mechanisms in Elastomer–Modified Epoxies," Journal of Materials Science, 1989, 24, pp. 2571–2580.
Hillmyer, et al., "Self–Assembly and Polymerization of Epoxy Resin–Amphiphilic Block Copolymer Nanocomposites," Journal of American Chemical Society, 1997, 119, pp. 2749–2750.
Hajduk, et al., "Complex Phase Behavior in Aqueous Solutions of Poly(ethylene oxide)–Poly(ethylethytane) Block Copolymers," Journal of Phys. Chem. B, 1998, 102, pp. 4269–4276.
Won, et al., "Cryogenic Transmission Electron Microscopy (Cryo–TEM) of Micelles and Vesicles Formed in Water by Poly(ethylene oxide)–Based Block Copolymers," Journal of Phys. Chem. B, 2002, 106, pp. 3354–3364.
Kinning, et al., "Structural Transitions from Spherical to Nonspherical Micelles in Blends of Poly(styrene–butadiene) Diblock Copolymer and Polystyrene Homopolymers," Macromolecules, 1998, 21, pp. 3502–3506.
Trent, et all, "Ruthenium Tetraoxide Staining of Polymers for Electron Microscopy," Macromolecules, 1983, 16, pp. 589–598.
Koulic, et al., "Vesicular Nanostructures Prepared by Reactive Melt Blending," Angew. Chem. Int. Ed., 2002, 41, No. 12, pp. 2154–2156.
Grubbs, et al., "Selectively Epoxidized Polyisoprene–Polybutadiene Block Copolymers," Macromolecules 2000, 33, pp. 2308–2310.

(Continued)

Primary Examiner—Michael J. Feely

(57) ABSTRACT

A curable flame retardant epoxy resin composition including (a) at least one flame retardant epoxy resin; (b) at least one amphiphilic block copolymer; and (c) a curing agent. Such components are present in the curable composition in the appropriate amounts and ratios such that, upon curing, the block copolymer self-assembles into a nano structure morphology, such as a worm-like micelle morphology. The resulting cured product made from the composition of the present invention has a remarkably increased high fracture resistance; and allows the use of flame retardant epoxies in applications where fracture resistance is an issue.

26 Claims, 4 Drawing Sheets

OTHER PUBLICATIONS

Lipic, et al., "Nanostructured Thermosets from Self–Assembled Amphiphilic Block Copolymer/Epoxy Resin Mixtures," Journal of American Chemical Society, 1998, 120, pp. 8963–8970.

Girard–Reydet, et al., "Splat: A Nonequilibrium Morphology on the Way to a Microemulsion," Macromolecules 2001, 34, pp. 5349–5353. (Abstract Only).

Hazot, et al., "Synthesis of Hairy Acrylic Core–Shell Particles as Toughening Agents for Epoxy Networks," Macromolecular Chemistry and Physics 2000, 201, pp. 632–641. (Abstract Only).

Grubbs, et al., "Nanostructur d Thermosets from Epoxyisoprene–butadiene Block Copolymers," Polymeric Materials Science and Engineering, 2000, 82, pp. 280–281. (Abstract Only).

Girard–Reydet, et al., "Use of Block Copolymers to Control the Morphologies and Properties of Thermoplastic/Thermoset Blends," Polymer 1998, 40, pp. 1677–1687. (Abstract Only).

Kim, et al., "The Phase Transformation Toughening and Synergism in Poly(Butylene Terephthalate)/Poly(Tetramethylene Glycol) Copolymer–Modified Epoxies", Journal of Materials Science 1998, 33, pp. 2421–2429. (Abstract Only).

Ishihara, et al.,"Modification of Epoxy Resin with Ethylene Oxide/Propylene Oxide Block Copolymer," Koen Yoshishu–Nippon Setchaku Gakkai Nenji Taikai 1996, 34, pp. 93–94. (Abstract Only).

Kim, et al., "The Effect of a Styrene–Methyl Methacrylate Block Copolymer on the Morphological, Rheological and Mechanical Properites of Poly(2,6–Dimethyl–1,4–Phenylene Ether) (PPE) and Poly(Hydroxy Ether of Bisphenol A) (Phenoxy) Blends," Polymer 1993, 34, pp. 4043–4051. (Abstract Only).

Kirk–Othmer Encyclopedia of Chemical Technology, $3^{rd}$ Ed., vol. 9, pp. 267–289.

DePetris, et al., "Crosslink Density and Fracture Toughness of Epoxy Resins," Journal of Materials Science, 1991, 26, pp. 2348–2352.

* cited by examiner

200nm

200nm 200 nm

CURABLE FLAME RETARDANT EPOXY COMPOSITIONS

FIELD OF THE INVENTION

The present invention relates to a curable flame retardant epoxy resin composition with increased toughness and fracture resistance, which is particularly useful for preparing electrical laminates.

BACKGROUND OF THE INVENTION

Thermoset resins such as epoxy resins are commonly used, for example, in the microelectronic and aircraft industries. The regulations of both the microelectronic and aircraft industries mandate the use of flame retardant epoxy resins. Typically, flame retardant epoxy resins include epoxy resins containing bromine. However, increasing the flame retardance of an epoxy resin, by brominating an epoxy resin, reduces its fracture resistance, making it difficult to process these materials into finished products.

For example, a major problem in the electronics industry is the drillability of brominated epoxy composites used in printed circuit board fabrication, because brominated epoxy composites are known to be very brittle. Thus, while bromination of epoxy compositions is necessary to improve the flame resistance of the epoxies, particularly when such epoxies are to be used in microelectronic applications, brominated epoxy resin materials used in microelectronic applications easily shatter during drilling procedures and, in turn, limit their applications.

Other known flame retardant epoxy resins useful in electrical laminates applications are non-brominated epoxy resins, for example, phosphorous-containing epoxy resins such as those described in U.S. Pat. No. 6,403,220; U.S. Patent Application Publication No. 2002/0119317 A1; and PCT Publication No. WO 99/00451. These bromine-free epoxy resins also have the disadvantage of being brittle and may be difficult to drill during printed circuit board fabrication.

Epoxies in general are known to be very difficult to toughen and some epoxies are too brittle to toughen effectively. Moreover, increasing the fracture toughness of brittle epoxies often comes at the expense of modulus and use temperature, creating unacceptable limits on the applicability of these resins.

Recent efforts have concentrated on using block copolymer self-assembly to toughen epoxies with a minimal impact on the glass transition temperature and modulus and with the advantages of simple processing and low cost. For example, Dean, J. M.; Lipic, P. M.; Grubbs, R. B.; Cook, R. F.; Bates, F. S. J., *"Micellar Structure and Mechanical Properties of Block Copolymer-Modified Epoxies,"* J. Polym. Sci. Part B Polymer Physics, 2001, 39, 2996–3010, discloses that block copolymers self-assembled into vesicles and spherical micelles can significantly increase the fracture resistance of model bisphenol A epoxies cured with a tetrafunctional aromatic amine curing agent; a general correlation between the ratio of the separation between particles and the particle diameter appears to conform to classical toughening mechanisms. These morphologies share the same basic spherical shape, but the larger dimensions of the vesicles produced up to a three-fold increase in the fracture resistance.

It would be desirable to find another way to further increase fracture resistance, and flame retardance of epoxy resins without sacrificing other properties of the epoxy resin such as use temperature and modulus.

It is desired to provide a composition with an improved fracture resistance, which overcomes the disadvantages of known materials, particularly which overcomes the drilling problems of prior materials.

SUMMARY OF THE INVENTION

One aspect of the present invention is directed to a curable epoxy resin composition including (a) at least one flame retardant epoxy resin; (b) at least one amphiphilic block copolymer; and (c) a curing agent.

Another aspect of the present invention is directed to a process for preparing a curable resin composition including mixing:

(a) at least one flame retardant epoxy resin;

(b) at least one amphiphilic block copolymer; and (c) a curing agent.

Still another aspect of the present invention is a cured resin product, such as a printed circuit board, made from the above curable resin composition.

The present invention is also directed to a new type of modifier morphology including self-assembled nanoparticle structures such as worm-like or spherical micelles. In one particular embodiment, the components of the present invention are present in appropriate amounts and ratios such that upon curing, the block copolymer self-assembles into a worm-like micelle morphology; and such that the fracture resistance of the resulting cured product is increased.

BRIEF DESCRIPTION OF THE DRAWINGS

FIG. 1A is one illustration representative of the block copolymer modified flame retardant epoxies of the present invention and clearly shows the differences in size and shape between the cylindrical geometry of the present invention and the geometry of the prior art.

FIG. 4 shows that worm-like micelles increase the fracture resistance to approximately 1000 J/m$^2$ even when the neat epoxy is too brittle to machine samples for mechanical testing (50 weight % epoxy).

DESCRIPTION OF THE PREFERRED EMBODIMENTS

Figure 1A:
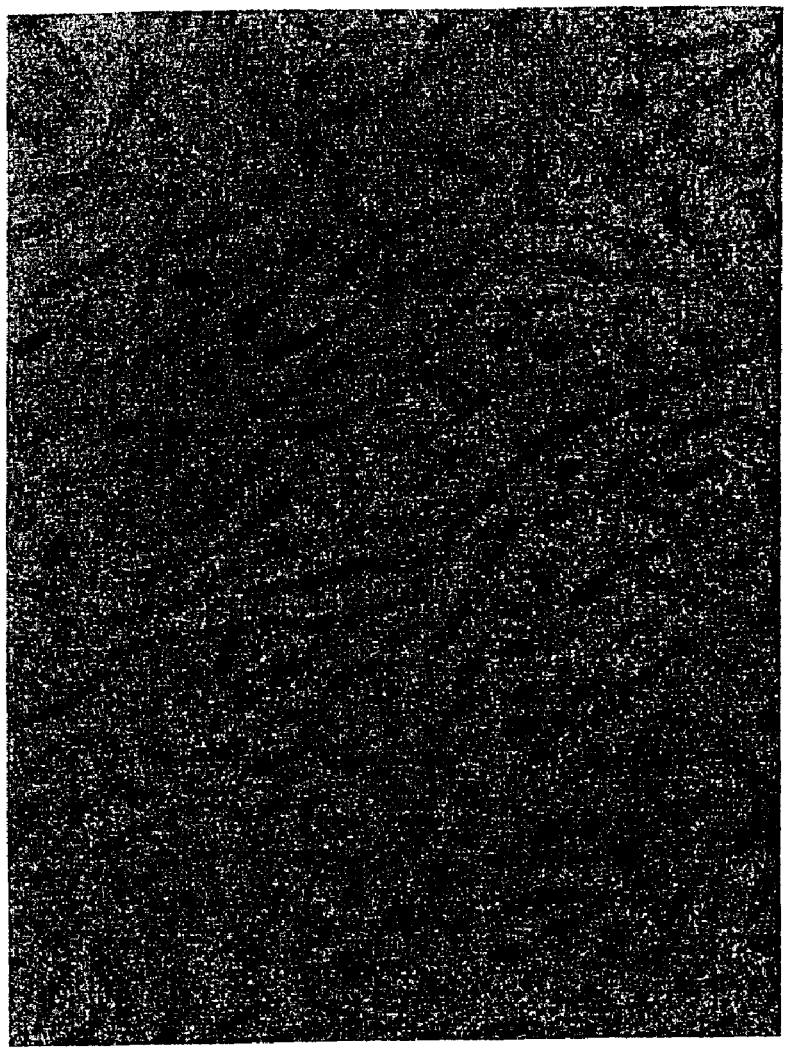
FIG. 1A is a transmission electron microscopy (TEM) image of worm-like micelles in an epoxy formulation cured with phenol novolac. This

In general, the present invention is a curable composition including a blend or mixture of (a) an epoxy resin or mixtures of several different epoxy resins, wherein at least one of the epoxy resins is a flame retardant epoxy resin; (b) at least one amphiphilic block copolymer containing an epoxy miscible block and an epoxy immiscible block; and (c) a curing agent or mixture of curing agents. The block copolymer is used as a modifier for mechanical properties enhancement of the blend.

The composition of the present invention has a remarkably high fracture resistance. The present invention is important because it utilizes a block copolymer additive that can be incorporated into a thermoset at low concentrations (for example, less than 5 weight percent) and at a low cost; and with minimal changes to current processing equipment.

The present invention provides a morphology created in the uncured state due to thermodynamic considerations and is not extremely sensitive to curing procedures. In addition, the present invention enables thermoset resins, such as epoxies, to be used in more applications where fracture resistance is an issue.

The present invention provides a method for preparing an epoxy resin thermoset, said method dramatically improving the fracture resistance of flame retardant epoxies with a minimal acceptable loss in modulus (between 5% and 20%) while not affecting the glass transition temperature.

The present invention demonstrates a remarkable enhancement in toughness with thermosets, for example, epoxy resins, such as a bisphenol A epoxy cured with phenol novolac, even when the epoxy formulation contains brominated epoxies to improve flame retardance. The present invention has important implications to applications requiring tough flame retardant thermosets, such as epoxy resins, such as in the microelectronics and advanced aircraft industries; and particularly for the manufacture of printed circuit boards and other applications where use temperature, flame retardance, and toughness are important.

The present invention provides a composition with a novel morphology by addition of block copolymers with the correct composition and architecture to induce self-assembly into a worm-like or spherical morphology. The micelles of the present invention are those which have a structure that contributes to the increased toughness of the epoxy resin matrix, e.g., worm-like or spherical in shape, as opposed to other geometric shapes such as vesicles.

Worm-like micelles self-assemble, for example, from two different types of block copolymers reproducibly improving the fracture resistance up to, for example, 190 times. Worm-like micelles are circular or elliptical in cross-sectional area. Generally, the worm-like miscelles are relatively long in comparison to their width, with an average aspect ratio of about 3:1 or greater, preferably 5:1 or greater, and more preferably 10:1 or greater.

Flame Retardant Epoxy Resin

One example of a flame retardant epoxy resin useful in the present invention is a brominated epoxy resin. The brominated epoxy resin component used in the curable epoxy resin composition of the present invention may be any brominated epoxy resin well known in the art. Examples of the bromine containing epoxy resins of the present invention include tetrabromo bisphenol A, diglycidyl ether of tetrabromo bisphenol A, and other brominated epoxies such as those commercially available from The Dow Chemical Company under the trademarks D.E.R. 560, D.E.R 542, D.E.R 592, D.E.R 593, D.E.R 530 and D.E.R 538; and mixtures thereof. A preferred epoxy resin containing bromine used in the present invention includes diglycidyl ether of tetrabromo bisphenol A such as D.E.R. 560

The present invention composition may contain at least one or more brominated epoxy resins. Two or more different brominated epoxy resins may be blended together to make up the flame retardant epoxy component of the present invention. The bromine content of the epoxy resin composition may be from about 5 wt percent (wt %) to about 50 wt %, preferably from about 10 wt % to about 25 wt %, and more preferably from about 18 wt % to about 21 wt %.

Another example of a flame retardant epoxy resin useful in the present invention is a "bromine-free" epoxy resin such as a phosphorous-containing epoxy resin disclosed in U.S. Patent Application Publication No. US 2002/0119317 A1, entitled "Flame Retardant Phosphorous Element Containing Epoxy Resin Compositions", published Aug. 29, 2002, incorporated herein by reference. Examples of phosphorous flame retardant epoxy resins disclosed in the above U.S. patent publication include non-halogenated phosphorus element-containing epoxy resin selected from those described in U.S. Pat. No. 5,376,453, incorporated herein by reference, including, for example, methyl diglycidyl phosphonate, ethyl diglycidyl phosphonate, propyl diglycidyl phosphonate, butyl diglycidyl phosphonate, vinyl diglycidyl phosphponate, phenyl diglycidyl phosphonate and biphenyl diglycidyl phosphonate; methyl diglycidyl phosphate, ethyl diglycidyl phosphate, n-propyl diglycidyl phosphate, n-butyl diglycidyl phosphate, isobutyl diglycidyl phosphate, allyl diglycidyl phosphate, phenyl diglycidyl phosphate, p-methoxyphenyl diglycidyl phosphate, p-ethoxyphenyl diglycidyl phosphate, p-propyloxyphenyl diglycidyl phosphate, p-isopropyloxyphenyl diglycidyl phosphate, phenylthiodiglycidyl phosphate, triglycidyl phosphate, tris(glycidylethyl) phosphate, p-glycidyl-phenyl ethyl glycidyl phosphate, benzyl diglycidyl thiophosphate, and combinations thereof.

Other examples of a non-halogenated phosphorus element-containing epoxy resin useful in the present invention is one which is obtained by epoxidizing a phosphorus element-containing compound including the epoxidized product of a phosphorus element-containing compound such as 9,10-dihydro-9-oxa-10-phosphaphenanthrene-10-oxide such as "Sanko-HCA," commercially available from Sanko of Japan, or "Struktol Polydis PD 3710," commercially available from Schill-Seilacher of Germany; 10(2',5'-dihydroxyphenyl)-9, 10-dihydro-9-oxa-10-phosphaphenanthrene-10-oxide (such as "Sanko HCA-HQ"); bis(4-hydroxyphenyl)phosphine oxide; tris(2-hydroxyphenyl)phosphine oxide; dimethyl-1-bis(4-hydroxyphenyl) 1-phenylmethylphonate; tris(2-hydroxy-4/5-methylphenyl)phosphine oxide tris(4-hydroxyphenyl) phosphine oxide, bis(2-hydroxyphenyl)phenylphosphine oxide, bis(2-hydroxyphenyl)phenylphosphinate, tris(2-hydroxy-5-methylphenyl)phosphine oxide; or mixtures thereof. The epoxidizing of the phosphorus element-containing compound is usually carried out with an epihalohydrin such as epichlorohydrin well known to those skilled in the art.

The phosphorous flame retardant epoxy resins may also include, for example, XZ92530, a phosphorous epoxy resin commercially available from The Dow Chemical Company.

Other phosphorous-containing epoxy resins used in the present invention are described in U.S. Pat. No. 6,403,220, and PCT Publication No. WO 99/00451, both of which are incorporated herein by reference.

The present invention composition may contain at least one or more phosphorous-containing epoxy resins. Two or more different phosphorous containing epoxy resins may be blended together to make up the flame retardant epoxy component of the present invention. The phosphorous content of the epoxy resin composition may be from about 0.05 wt % to about 20 wt %, preferably from about 10 wt % to about 10 wt %, and more preferably from about 0.2 wt % to about 5 wt %.

The brominated epoxy resin and the phosphorous-containing epoxy resin may be used alone, or mixed together; or the epoxy resins may be combined with other flame retardant epoxy resins.

In another embodiment of the present invention, the flame retardant epoxy resin component may be mixed or blended with another non-flame retardant epoxy resin. The non-flame retardant epoxy resin may be a halogenated, other than bromine, epoxy resin. The non-bromine, halogenated epoxy resin may be, for example, a chlorine-containing epoxy resin. The non-flame retardant epoxy resin may also be a non-halogenated epoxy resin such as a diglycidyl ether of bisphenol A.

If an additional epoxy resin is used in addition to the flame retardant epoxy resin, there are numerous epoxy resins well known in the art that can be selected to be blended in with the brominated epoxy resin. Such additional epoxy resin compounds useful in the practice of the present invention are known polyepoxides. The polyepoxide compound useful in the practice of the present invention is suitably a compound or a mixture of compounds, which possesses more than one 1,2-epoxy group. In general, the polyepoxide compound is a saturated or unsaturated aliphatic, cycloaliphatic, aromatic or heterocyclic compound which possesses more than one 1,2-epoxy group. The polyepoxide compound can be substituted with one or more substituents such as lower alkyls and halogens. Such polyepoxide compounds are well known in the art. Illustrative polyepoxide compounds useful in the practice of the present invention are described in the *Handbook of Epoxy Resins* by H. E. Lee and K. Neville, published in 1967 by McGraw-Hill, New York, and U.S. Pat. No. 4,066,628, incorporated herein by reference.

Particularly useful polyepoxide compounds, which can be used in the practice of the present invention, are polyepoxides having the following general formula:

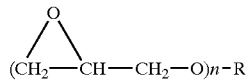

Wherein R is substituted or unsubstituted aromatic, aliphatic, cycloaliphatic or heterocyclic polyvalent group and n had an average value of from 1 to less than about 8.

Polyepoxide, as used herein, also includes partially advanced epoxy resins, that is the reaction of a polyepoxide and a chain extender, wherein the reaction product has, on average, more than one unreacted epoxide unit per molecule.

As an illustration of the present invention, examples of known epoxy resins that may be used in the present invention, include, for example, aliphatic polyepoxides such as those prepared from the known reaction of epihalohydrins and polyglycols. Other specific examples of aliphatic epoxides include trimethylpropane epoxide, and diglycidyl-2-cyclohexane dicarboxylate. Polyepoxides, which can be employed herein, can also include epoxy resins such as, for example, the glycidyl ethers of polyhydric phenols, that is, compounds having an average of more than one aromatic hydroxyl group per molecule such as, for example, dihydroxy phenols, biphenols, bisphenols, halogenated biphenols, halogenated bisphenols, alkylated biphenols alkylated bisphenols, trisphenols, phenol-aldehyde novolac resins, substituted phenol-aldehyde novolac resins, phenol-hydrocarbon resins, substituted phenol-hydrocarbon resins and any combination thereof.

Preferably, the polyepoxides (polyglycidyl ethers of a polyhydroxy hydrocarbon) may be prepared by reacting an epihalohydrin with a polyhydroxy hydrocarbon or a halogenated polyhydroxy hydrocarbon. The preparation of such polyepoxide compounds is well known in the art (see *Kirk-Othmer Encyclopedia of Chemical Technology,* 3rd Ed., Vol. 9, pp. 267–289).

The epihalohydrins correspond to the following general formula:

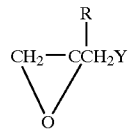

wherein Y is a halogen, preferably chlorine or bromine, and most preferably chlorine; R is hydrogen, or $C_{1-4}$ alkyl, and more preferably methyl.

Polyhydroxy hydrocarbon means a compound with a hydrocarbon backbone and on average more than one primary or secondary hydroxy moieties, preferably two or more. Halogenated polyhydroxy hydrocarbon means a compound with a hydrocarbon backbone, which is substituted with one or more halogens and more than one, preferably two or more, primary or secondary hydroxy moieties. The hydroxyl moieties may be aromatic, aliphatic or cycloaliphatic. Polyfunctional dihydroxyhydrocarbons or halogenated dihydroxy hydrocarbons useful are well known in the art (see, for example, Lee and Neville, supra; and Bertram, U.S. Pat. No. 4,594,291, col. 8, lines 24–36).

Among even more preferred classes of polyhydroxy hydrocarbons and halogenated polyhydroxy hydrocarbons are the dihydroxy phenols; biphenols; bisphenols; halogenated bisphenols; alkylated bisphenols; trisphenols; hydrogenated bisphenols; novolac resins, i.e., the reaction product of phenols, including halogenated and alkylated phenols, and simple aldehydes, preferably formaldehyde and hydroxybenzaldehyde; and polyalkylene glycols.

The most preferred class of polyhydroxy hydrocarbons is the dihydroxy phenols including those, which contain substituents, that are non-reactive with the phenolic groups. Illustrative of such phenols are 2,2-bis(3,5-dibromo4-hydroxyphenyl) propane; 2,2-bis(4-hydroxyphenyl) propane; 2,2-bis(3,5-dichloro-4-hydroxyphenyl) propane; bis (4-hydroxyphenyl) methane; 1,1-bis(4-hydroxyphenyl)-1-phenyl ethane; 1,1'-bis(2,6-dibromo-3,5-dimethyl-4:hydroxyphenyl) propane; bis (4-hydroxyphenyl) sulfone; bis (4-hydroxyphenyl) sulfide; resorcinol and hydroquinone.

Preferred dihydroxy phenolic compounds are 2,2-bis(4-hydroxyphenyl) propane (bisphenol A), trimethylolpropane, 1,3,5-tris-(2-hydroxyethyl)-1,3,5-triazin-2,4,6-1H,3H,5H)-trion, and 2,2-bis(4-hydroxy-3,5-dibromophenyl) propane, the diglycidyl ethers of resorcinol, catechol, hydroquinone, bisphenol, bisphenol A, bisphenol AP (1, 1-bis(4-hydroxylphenyl)-1-phenyl ethane), bisphenol F, bisphenol K, tetrabromobisphenol A, phenol-formaldehyde novolac resins, alkyl substituted phenol-formaldehyde resins, phenol-hydroxybenzaldehyde resins, cresol-hydroxybenzaldehyde resins, dicyclopentadiene-phenol resins, dicyclopentadiene-substituted phenol resins tetramethylbiphenol, tetramethyltetrabromobiphenol, tetramethyltribromobiphenol, tetrachlorobisphenol A and any combination thereof.

Examples of diepoxides particularly useful in the present invention include diglcidyl ether of 2,2-bis(4-hydroxyphenyl) propane (generally referred to as bisphenol A) and diglycidyl ether of 2,2-bis(3,5-dibromo-4-hydroxyphenyl) propane (generally referred to as tetrabromobisphenol A). Mixtures of any two or more polyepoxides can also be used in the practice of the present invention.

Other useful epoxide compounds, which can be used in the practice of the present invention, are cycloaliphatic epoxides. A cycloaliphatic epoxide consists of a saturated carbon ring having an epoxy oxygen bonded to two vicinal atoms in the carbon ring, for example, as illustrated by the following general formula:

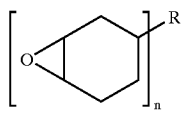

wherein R is as defined above and n is as defined above.

The cycloaliphatic epoxide may be a monoepoxide, a diepoxide, a polyepoxide, or a mixture of those. For example, any of the cycloaliphatic epoxide described in U.S. Pat. No. 3,686,359, incorporated herein by reference, may be used in the present invention. As an illustration, the cycloaliphatic epoxides that may be used in the present invention include, for example, (3,4-epoxycyclohexyl-methyl)-3,4-epoxycyclohexane carboxylate, bis-(3,4-epoxycyclohexyl) adipate, vinylcyclohexene monoxide and mixtures thereof.

The amount of the flame retardant epoxy resin component used in the present invention may be greater than 10 phr in a typical varnish e n composition. The amount of flame retardant is suitably in the range of from about 30 phr to about 90 phr, preferably from about 40 phr to 70 phr, and more preferably from about 55 phr to 65 phr, based on the total weight of the varnish composition (herein defined as resin+curing agent+catalyst+solvent). If the amount of epoxy resin used is less than 10 phr, the resultant epoxy resin will become extremely brittle and will be very difficult to handle. If the amount of epoxy resin component used exceeds 90 phr, the resultant epoxy resin may not achieve an adequate flame retardancy and the epoxy resin may lose stiffness or modulus.

As aforementioned, the epoxy resin component useful in the present invention may include, for example, both halogenated and non-halogenated epoxy resins. For example, brominated and non-brominated bisphenol A type epoxies cured with phenol novolac may be used in the present invention.

As an example of one embodiment of the present invention, the epoxy resin component of the present invention may be formulated by mixing two poly(bisphenol-A-co-epichlorohydrin) epoxies, one epoxy resin with brominated aromatic rings, such as, for example, D.E.R. 560 (available from The Dow Chemical Company) having a $M_w$ of 900 g/mole and EEW of 450; and one epoxy resin without bromination, such as, for example, D.E.R. 383 (available from The Dow Chemical Company) having a $M_w$ of 360 g/mole and an EEW of 178. Both epoxies may be cured with stoichiometric amounts of a hardener such as phenol novolac hardener, for example a phenolic hardener having a $M_w$ of 472.5 g/mole and an OH numbered average of 104. The phenolic harder is also available from The Dow Chemical Company.

Block Copolymer

The present invention utilizes amphiphilic block copolymers containing an epoxy miscible block and an epoxy immiscible block.

Examples of the epoxy immiscible part of the block copolymer include polyethylene propylene (PEP), polybutadiene, polyisoprene, polydimethyl siloxane polybutylene oxide, polyhexylene oxide, polyalkyl methyl methacrylate, such as polyethyl hexyl methacrylate, and mixtures thereof. Examples of the epoxy miscible part of the block copolymer include polyethylene oxide, polymethyl acrylate, and mixtures thereof.

The present invention composition may contain at least one or more amphiphilic block copolymers. Two or more different amphiphilic block copolymers may be blended together to make up the block copolymer component of the present invention. In general, one block is miscible and one block is immiscible. More than one block copolymer can be combined to gain additional control of the nanostructure, i.e., shape and dimension.

Small amounts of homopolymers from each of the respective blocks may be present in the final amphiphilic block copolymer of the present invention.

The amphiphilic type of block copolymers used in the present inventions preferably increase the fracture resistance, at preferably low loadings of block copolymer in a brominated epoxy resin composition. The increase in fracture resistance in an epoxy resin can be generally greater than 5 times, preferably greater than 10 times, and more preferably up to about 50 times. The loading block copolymer in the epoxy resin composition may be generally from about 0.1 wt % to about 30 wt %, preferably from about 0.5 wt % to about 20 wt %, more preferably from about 1 wt % to about 10 wt %; and most preferably from about 2 wt % to about 5 wt %. Typically, a loading from about 5 weight percent or less is used.

It is believed that the increase in fracture resistance occurs when the block copolymers self-assemble into a nanoscale morphology such as worm-like or spherical micelle morphology. While it is not well understood how the worm-like or spherical micelle morphology occurs, it is believed that factors that determine the self-assembled morphology may include, for example, (i) the choice of monomers in the block copolymer, (ii) the degree of asymmetry in the block copolymer, (iii) the block copolymer molecular weight (iv) the composition of the epoxy resin and (v) the choice of curing agent for the epoxy. Apparently, a nanoscale morphology plays an important role in creating toughness in an epoxy resin product.

Examples of suitable block copolymers useful in the present invention include amphiphilic block copolymers such as, for example, poly(ethylene oxide)-b-poly(ethylene-alt-propylene) (PEO-PEP); poly(methyl methacrylate-co-glycidyl methacrylate)-b-poly(octylmethylmethacrylate); and poly(methyl methacrylate-ran-glycidyl methacrylate)-poly(2-ethylhexyl methacrylate) (P(MMA-ran-GMA)-PEHMA) may be used. Table I lists the physical characteristics of various block copolymers including the weight % of the epoxy miscible block in the block copolymer, the block copolymer molecular weight, and the polydispersity.

TABLE I

Molecular Characteristics of Block Copolymer Modifiers

| Diblock[a, b] | Weight % epoxy miscible block | $M_n$ (total) (g/mole) | $M_w/M_n$ |
|---|---|---|---|
| PEO-PEP-15 | 32 | 8,000 | 1.04 |
| PEO-PEP-9 | 48 | 16,800 | 1.10 |

[a]first block denoted is epoxy resin miscible
[b]PEO: poly(ethylene oxide); PEP: poly(ethylene-alt-propylene)

A description and preparation of the block copolymers useful in the present invention is described, for example, in a) R. B. Grubbs, J. M. Dean, F. S. Bates, "Methacrylate Block Copolymers through Metal-Mediated Living Free-Radical Polymerization for Modification of Thermosetting Epoxy," *Macromolecules*, 34, 8593 (2001); b) R. B. Grubbs, J. M. Dean, M. E. Broz, F. S. Bates, "Reactive Block Copolymers for Modification of Thermosetting Epoxy," *Macromolecules*, 33, 9522 (2000); and c) M. A. Hiimnyer, F. S. Bates, "Synthesis and Characterization of Model Polyalkane-Poly(ethyleneoxide) Block Copolymers," *Macromolecules*, 29, 6994 (1996).

The PEO-PEP block copolymer generally has a molecular weight of from about 2000 g/mole to about 300,000 g/mole, preferably from about 5,000 g/mole to about 30,000 g/mole, and more preferably from about 6,000 g/mole to about 15,000 g/mole. The PEO-PEP block copolymer generally has a PEO weight fraction ($W_{PEO}$) of from about 0.1 to about 0.8; preferably from about 0.2 to about 0.6; and more preferably from about 0.25 to about 0.5. The PEO-PEP block copolymer generally has a polydispersity (PDT or Mw/Mn) index of from about 1.001 to about 2.5; preferably from about 1.01 to about 1.5; and more preferably from about 1.01 to about 1.2.

Curing Agent

The curing agent component (also referred to as a hardener or cross-linking agent) useful in the present invention may be any compound having an active group being reactive with the epoxy group of the epoxy resin. The chemistry of such curing agents are described in the previously referenced books on epoxy resins. The curing agent useful in the present invention includes nitrogen-containing compounds such as amines and their derivatives; oxygen-containing compounds such as carboxylic acid terminated polyesters, anhydrides, phenol-formaldehyde resins, amino-formaldehyde resins, phenol, bisphenol A and cresol novolacs, phenolic-terminated epoxy resins; sulfur-containing compounds such as polysulfides, polymercaptans; and catalytic curing agents such tertiary amines, Lewis acids, Lewis bases and combinations of those curing agents.

Practically, polyamines, dicyandiamide, diaminodiphenylsulfone and their isomers, aminobenzoates, various acid anhydrides, phenol-novolac resins and cresol-novolac resins, for example, may be used in the present invention, but the present invention is not restricted to the use of these compounds.

Another embodiment of cross-linkers useful in the present invention are described in U.S. patent application Ser. No. 09/008,983, entitled "Latent Catalysts for Epoxy Curing Systems," filed Jan. 20, 1998, by Gan, et al., which is incorporated herein by reference, and include, for example, copolymers of styrene and maleic anhydride having a molecular weight ($M_w$) in the range of from 1500 to 50,000 and an anhydride content of more than 15 percent. Commercial examples of these materials include SMA 1000, SMA 2000, and SMA 3000 having styrene-maleic anhydride ratios of 1:1, 2:1, and 3:1, respectively, and having molecular weights ranging from 6,000 to 15,000; and which are available from Elf Atochem S.A.

Other Optional Components

In addition to the polyepoxide, block copolymer, and curing agent, the curable epoxy resin composition of the present invention may include a catalyst as an optional component. The catalyst may be a single component or a combination of two or more different catalysts. Catalysts useful in the present invention are those catalysts which catalyze the reaction of a polyepoxide with a curing agent (also know as a hardener or cross-linker). A preferred catalyst is one which remains latent in the presence of an inhibitor at low temperatures (i.e., non-curing temperatures). Preferably the catalyst is latent at temperatures of about 140° C. or below, and more preferably at about 150° C. or below.

Latency is demonstrated by an increase of at least about 10 percent in gel time as determined by a stroke cure test performed at about 150° C. to about 170° C. Examples of preferred catalysts are compounds containing amine, phosphine, heterocyclic nitrogen, ammonium, phosphonium, arsonium or sulfonium moieties. Examples of more preferred catalysts are the heterocyclic nitrogen and amine containing compounds and even more preferred compounds are heterocyclic nitrogen containing compounds.

Any of the well-known catalysts described in U.S. Pat. No. 4,925,901, incorporated herein by reference, may be used in the present invention. As an illustration, examples of the known catalysts that may be used in the present invention include, for example, suitable onium or amine compounds such as ethyltriphenyl phosphonium acetate, ethyltriphenyl phosphonium acetate-acetic acid complex, triethylamine, methyl diethanolamine, benzyldimethylamine, and imidazole compounds such as 2-methylimidazole and benzimidazole.

The catalysts, when present, are employed in a sufficient amount to result in a substantially complete cure of the epoxy resin, with some cross-linking. For example, the catalyst may be used in an amount of from about 0.01 to about 5 parts per hundred parts of resin, with from about 0.01 to about 1.0 parts per hundred parts of resin being preferred and from about 0.02 to about 0.5 catalyst per hundred parts of resin being more preferred.

Concentrations of components used in the present invention are measured as parts by weight of components per hundred parts of resin by weight (phr), unless otherwise noted. The "resin" in the definition of "phr" herein refers to the polyepoxide, the block copolymer and the curing agent together in the composition.

Another optional component useful in the epoxy resin composition of the present invention is a reaction inhibitor. The reaction inhibitor may include boric acid, Lewis acids containing boron such as alkyl borate, alkyl borane, trimethoxyboroxine, an acid having a weak nucleophilic anion, such as, perchloric acid, tetrafluoboric acid, and organic acids having a pKa from 1 to 3, such as, salicylic acid, oxalic acid and maleic acid. Boric acid, as used herein, refers to boric acid or derivatives thereof, including metaboric acid and boric anhydride; and combinations of a Lewis acid with boron salts such as alkyl borate or trimethoxyboroxine. When an inhibitor is used in the present invention, boric acid is preferably used. The inhibitor and catalyst may be separately added, in any order, to the curable epoxy resin composition of the present invention, or may be added as a complex.

The amount of the inhibitor present relative to the catalyst in the epoxy resin composition of the present invention can be adjusted to adjust the gel time of the epoxy resin composition. At constant levels of catalyst, an increasing amount of inhibitor will yield a corresponding increase in the gel time. At a desired catalyst level the relative amount of inhibitor can be decreased to decrease the gel time. To increase the gel time the amount of inhibitor can be increased without changing the catalyst level.

The molar ratio of inhibitor (or mixture of different inhibitors) to catalyst is that ratio which is sufficient to significantly inhibit the reaction of the polyepoxide as exhibited by an increase in gel time as compared to a like composition free of inhibitor. Simple experimentation can determine the particular levels of inhibitor or mixtures, which will increase in gel time but still allow a complete cure at elevated temperatures. For example, a preferable molar ratio range of inhibitor to catalyst, where up to about 5.0 phr of boric acid is used, is from about 0.1:1.0 to about 10.0:1.0, with a more preferred range being from about 0.4:1.0 to about 7.0:1.0.

Another optional component, which may be added to the curable epoxy resin composition of the present invention, is a solvent or a blend of solvents. The solvent used in the epoxy resin composition is preferably miscible with the other components in the resin composition. In addition, the curable epoxy resin composition of the present invention may be a clear solution or a stable dispersion depending on the optional solvents used in the composition. The solvent used is selected from those typically used in making electrical laminates. Examples of suitable solvents employed in the present invention include, for example, ketones, ethers, acetates, aromatic hydrocarbons, cyclohexanone, dimethylformamide, glycol ethers, and combinations thereof.

Preferred solvents for the catalyst and the inhibitor are polar solvents. Lower alcohols having from 1 to 20 carbon atoms, such as, for example, methanol, provide good solubility and volatility for removal from the resin matrix when prepregs are formed.

Polar solvents are particularly useful to dissolve inhibitors of boric acid or Lewis acids derived from boron. If the polar solvents are hydroxy containing, there exists a potential competition for available carboxylic acid anhydride between the hydroxy moiety of the solvent and the secondary hydroxyl formed on opening of the oxirane ring. Thus, polar solvents which do not contain hydroxyl moieties are useful, for example, N,-methyl-2-pyrrolidone, dimethylsulfoxide, dimethylformamide, and tetrahydrofuran. Also useful are dihydroxy and trihydroxy hydrocarbons optionally containing ether moieties or glycol ethers having two or three hydroxyl groups. Particularly useful are $C_{2-4}$ di- or trihydroxy compounds, for example, 1,2-propane diol, ethylene glycol and glycerine. The polyhydroxy functionality of the solvent facilitates the solvent serving as a chain extender, or as a co-cross-linker according to the possible mechanism previously described concerning co-cross-linkers.

The total amount of solvent used in the curable epoxy resin composition generally may be between about 20 and about 60 weight percent, preferably between about 30 and about 50 weight percent, and most preferably between about 35 and about 45 weight percent.

The curable epoxy resin composition according to the present invention may contain usual additives such as fillers, dyes, pigments, thixotropic agents, surfactants, fluidity control agents, stabilizers, diluents that aid processing, adhesion promoters, flexibilizers, toughening agents and fire retardants.

Preparation of Blend

In the preparation of the blend or composition of the present invention, the components are mixed together by known means in the art at conditions to form a curable composition, preferably in liquid form. The curable epoxy resin composition of the present invention can be produced by mixing all the components of the composition together in any order. Alternatively, the curable epoxy resin composition of the present invention can be produced by preparing a first composition comprising the brominated epoxy resin component and block copolymer; and a second composition comprising the curing agent component. All other components useful in making the epoxy resin composition may be present in the same composition, or some may be present in the first composition, and some in the second composition. The first composition is then mixed with the second composition to form the curable epoxy resin composition. The curable epoxy resin composition mixture is then cured to produce an epoxy resin thermoset material. Preferably, the curable epoxy resin composition is in the form of a solution, wherein the components of the composition are dissolved in a solvent. Such solution or varnish is used for producing a coated article.

As aforementioned, a neutral solvent may be employed in the blend to facilitate homogeneous mixing of the block copolymer, brominated epoxy, and curing agent The preferred optional solvent used in the present invention may include, for example, acetone and MEK. In addition, other solvent choices can also be used as long as it dissolves all the components.

Time and temperature of the process is not critical, but generally the components can be mixed at a temperature of from about 10° C. to about 60° C., preferably from about 20° C. to about 60° C. and more preferably from about 25° C. to about 40° C. for a sufficient time period until complete homogeneity is achieved.

Curing Process

The mixture of epoxy resin, curing agent, block co-polymer, solvent, catalyst and any other modifiers present in the composition can be cured according to typical processes practiced by the industry. These processes include ambient temperature cure to elevated temperature cures using thermal, radiation or a combination of energy sources. The curable composition can be cured in one step or multiple steps such as A, B staged cures often practiced in the electrical laminates and composites industries. Or, the curable composition can be post-cured using a different temperature or energy source after the initial cure cycle. A typical electrical laminate cure schedule involves an A to B stage cure at for example from about 90° C. to about 210° C. for about 1 minute to about 15 minutes followed by a B to C stage cure in a consolidation press at for example from about 100° C. to about 230° C. for about 1 minute to about 200 minutes under a pressure of from about 50 $N/cm^2$ to about 500 $N/cm^2$.

The curable epoxy resin composition of the present invention may be used to coat any article for which a coating is desired. The article may be coated with the composition of the present invention using any method known to those skilled in the art, including, for example, powder-coating, spray-coating, and contacting the article with a bath containing the composition. Such article can be coated with the epoxy resin composition, and the coating can be partially cured or fully cured. In the embodiment where the coating is partially cured, the article may be further processed such that the partially cured resin may be finally cured. The article coated can be any substrate, for example, metal, cement and reinforcing material. In one embodiment, the article is a fibrous reinforcing material for composites, prepregs or laminates.

The curable epoxy resin composition according to the present invention can be employed to make composites for, inter alia, the electronics, construction, aviation, and automobile industries. The curable epoxy resin composition of the present invention may be used to make composite materials by techniques well known in the industry such as by impregnating a reinforcing material with molten or dissolved resin, or via resin transfer molding, filament winding, pultrusion or RIM (reaction injection molding) and other moulding, encapsulation, or coating techniques. Also, the curable epoxy resin compositions according to the present invention can be employed wherever use is made of conventional epoxy resins, such as a glue, coating, molding resin, embedding resin, encapsulating resin, sheet molding compound, or bulk molding compound.

The epoxy resin composition of the present invention is particularly useful for making B-staged prepegs and laminates, for example, for printed wiring boards, by well-known techniques in the industry. The present invention is preferably directed to laminates for use in the electronics industry incorporating the epoxy resin composition of the present invention. It was found that even when the resin composition is based on simple difunctional epoxy compounds, the combination of resin components according to the present invention will give excellent properties for application in the electronics industry.

Generally, laminates for use in the electronics industry, particularly for printed wiring boards, are produced by impregnating a supporting or reinforcing material with the epoxy resin composition of the present invention, followed by the resin being cured wholly or in part. A reinforcing material impregnated with a partially cured resin is usually referred to herein as the "prepeg". To make a printed wiring board from prepegs, one or more layers of prepegs are laminated with, for example, one or more layers of a metallic material such as copper.

The reinforcing material, which may be impregnated with the epoxy resin composition of the present invention, include any material which would be used by the skilled artisan in formation of composites, prepregs and laminates. Examples of the forms of such reinforcing materials are woven fabric, cloth, mesh, web, or fibers, or in the form of a cross-ply laminate of unidirectionally oriented parallel filaments. Generally, such reinforcing materials are made from a variety of materials such as glass fibers, paper, plastics such as aromatic polyamides, graphite, glass, quartz, carbon, boron fibers, and organic fibers such as, for instance, aramid, teflon, syndiotactic polystyrene, more particularly to make laminates for printed wiring boards. In one preferred embodiment, the reinforcing materials include glass or fiberglass, in cloth or web form. As an illustration of the present application, the epoxy resin composition according to the present invention are highly suitable for impregnating, for example, woven glass fabric.

Cured Product

A cured resin product may be obtained by heating the curable epoxy resin composition at a temperature of from about 100° C. to about 230° C. and preferably from about 165° C. to about 190° C. for a time period of from about 1 minute to about 200 minutes and preferably from 45 minutes to about 90 minutes. Optionally, molded forms of the cured product may be further post-cured at a temperature of from about 120° C. to about 250° C. for a time period of from about 30 minutes to about 12 hours under vacuum. This desirably produces a homogeneous, void-free, and fully cured epoxy resin product.

Fully-cured compositions made from the curable composition of the present invention containing the worm-like micelle morphology have at least three unusual characteristics compared to other compositions containing block copolymers self-assembled into other morphologies, such as vesicles. A first trait is an elevation of up to 50° C. in the glass transition temperature of these blends as measured using dynamic mechanical spectroscopy not explained by the glass transitions in the block copolymer itself. A second trait is a decrease in the modulus of these materials, around 50%, compared to decreases around 20–30% for the vesicle morphology. A third trait is an increase in the critical stress intensity factor, $K_{Ic}$, as measured from compact tension experiments. The strain energy release rate, $G_c$, is calculated using linear elastic fracture mechanics and, thus, the improvements in $G_c$ is a combination of both the reduction in the modulus and, more importantly, the increase in $K_{Ic}$.

An advantage of the present invention is that epoxy compositions containing brominated epoxies, which are known to be very brittle and subject to drilling problems, can now be used in microelectronic applications, because with the addition of block copolymers with the correct composition and architecture to induce self-assemble into a worm-like morphology, it should be possible to circumvent this drilling problem with the increase in fracture resistance of these materials.

Figure 1B:
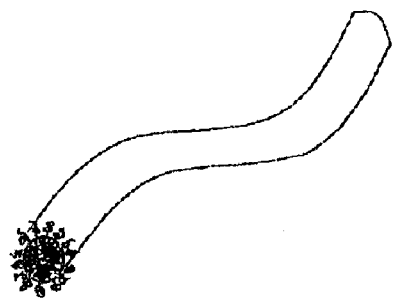
FIG. 1B shows a representation of the worm-like geometry and configuration of FIG. 1A.
Figure 2A:
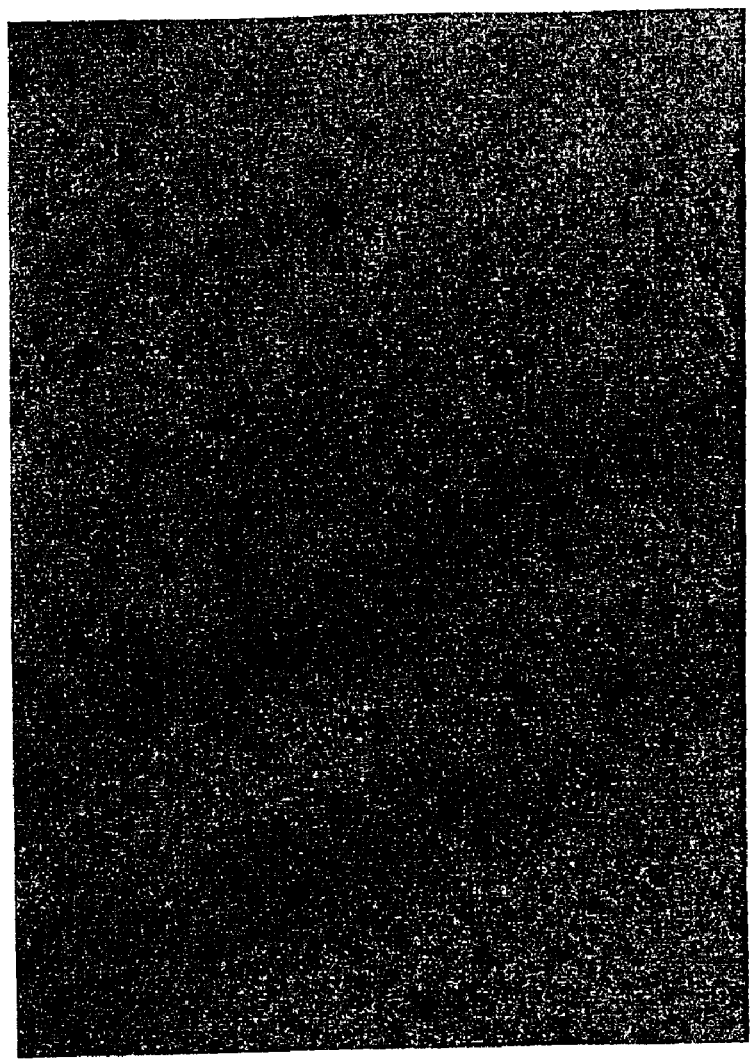
FIG. 2A is a TEM image of spherical micelles in an epoxy formulation cured with phenol novolac.
Figure 2B:
FIG. 2B shows a representation of the spherical micelles geometry and configuration of FIG. 2A.
Figure 3A:
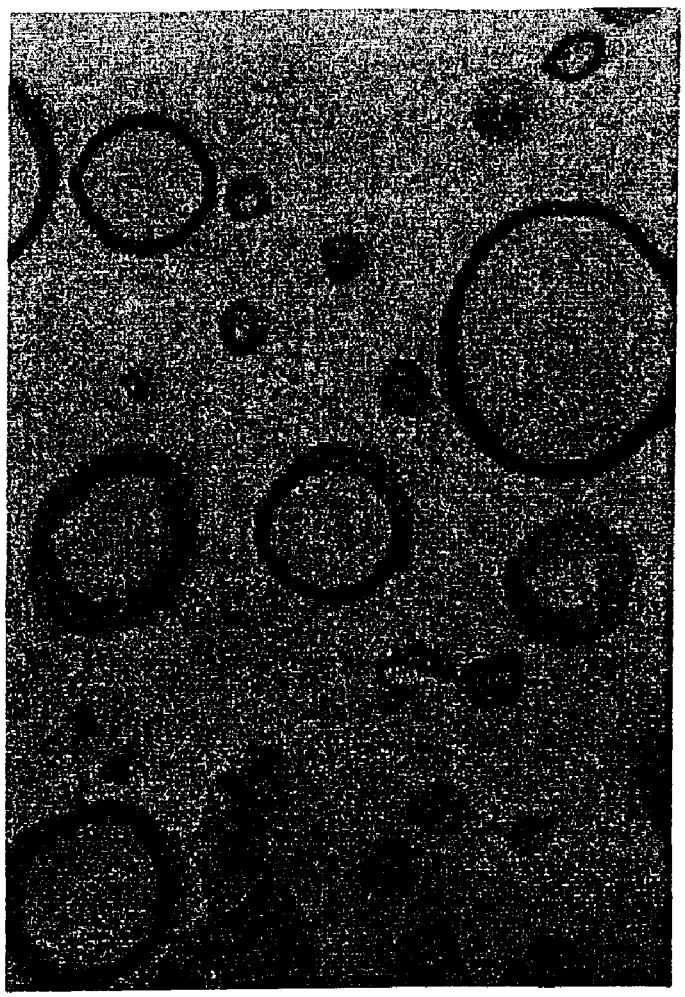
FIG. 3A is a TEM image of vesicles in an epoxy formulation cured with phenol novolac.
Figure 3B:
FIG. 3B shows a representation of the vesicles geometry and configuration of FIG. 3A.

In the dilute limit, block copolymers self-assemble into disordered worm-like micelles or spherical micelles. Each of these morphologies can be generated in cured brominated and non-brominated epoxy resins and representative images are shown in FIGS. 1–2. Spherical micelles, shown in FIGS. 2A and 2B, contain a hydrocarbon core surrounded by an epoxy compatible corona. In contrast, cylindrical ("worm-like") micelles, shown in FIGS. 1A and 1B, are long, thin tubes where the epoxy miscible block forms a corona shielding the epoxy immiscible cylinder interior. The two morphologies are formed by the PEO-PEP and P(MMA-ran-GMA)-PEHMA diblock copolymers, where the equilibrium phase is largely determined by the block copolymer asymmetry (i.e., the relative length of the epoxy miscible block). The morphology is established in the initial unreacted block copolymer-resin mixture, which becomes permanently fixed during the curing stage. The epoxy resin used for FIGS. 1–3 is a 3:1 blend of D.E.R. 383/D.E.R. 560 epoxy formulation.

Figure 4:
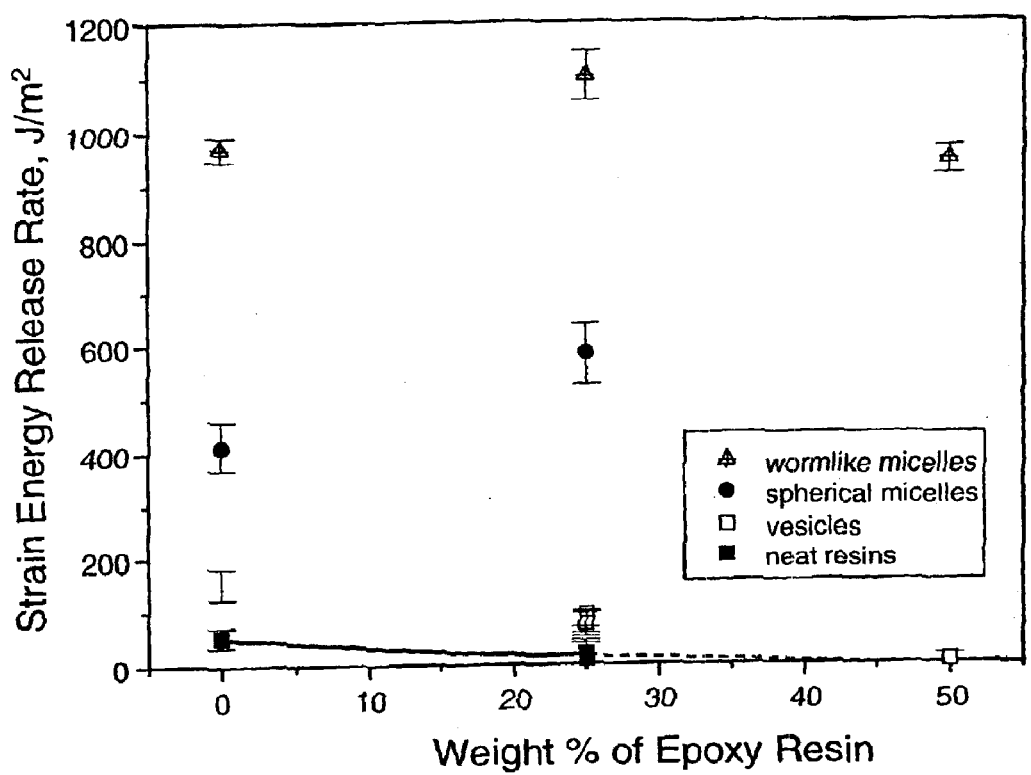
FIG. 4 is a graphical illustration showing strain energy release rate as a function of epoxy resin content in the epoxy formulation for worm-like micelle, spherical micelle, and vesicle modified epoxies; and neat resin.

Modifying an epoxy resin with a block copolymer may reduce the modulus, although not significantly. However, FIG. 4 shows that the strain energy release rate, $G_c$, of worm-like modified epoxies (for example, D.E.R. 560) increases dramatically even as the amount of brominated epoxy in the formulation increases to 50 weight %. FIG. 4 also shows the fracture resistance of neat epoxy resins, for example, D.E.R.560. Neat resins may also include amine cured bisphenol A epoxy (BPA348, $M_w$=348 g/mole, cured with 4,4'-methylenedianiline, MDA). Worm-like micelles gave the best improvements in $G_c$, as shown in FIG. 4.

The present invention demonstrates a way to simultaneously increase the fracture resistance and flame retardance of epoxy resins. The present discovery has important implications for both the microelectronic and aircraft industries where regulations mandate the use of flame retardant epoxy resins. Typically, increasing the flame retardance of an epoxy resin reduces its fracture resistance, making it difficult to process these materials into finished products. For example, a major problem in the microelectronics industry is the drillability of brominated epoxy composites used in printed circuit board fabrication. This deficiency is evident in the inability to machine test samples, for example, from neat 1:1 DER 383/DER 560 formulations. The materials of the present invention are easy to process since self-assembly occurs spontaneously upon blending and the resulting viscosity is marginally affected at the low block copolymer loadings described here.

Often an increase in fracture resistance comes at the expense of the use temperature and modulus. In the present invention, both fracture resistance and flame retardance is achieved without a major reduction in the modulus and with an increase in the use temperature. Thus, a way has been found to circumvent the typical trade-off in epoxies where toughness comes at the expense of other desirable properties. For example, some of the toughest resins of the present invention have a modulus reduction of, for example, only 5 to 10 percent while their $T_g$ increases, for example, up to about 16%.

Clearly, the materials of the present invention do not follow the patterns described in the epoxy toughening literature where it was previously concluded that some epoxies were too brittle to toughen effectively.

The epoxy thermosetting composition of the present invention has a good workability and provides a cured resin product having high toughness, high elongation, high modulus, low internal stress and, furthermore, high heat resistance and low water absorption ratio and high stability of these characteristics. As an illustration, a cured resin product of the present invention has, for example, a strain energy release rate (GIC) of at least about 100 J/m2, and a glass transition temperature ($T_g$) of at least about 100° C.

A number of preferred embodiments of the present invention are illustrated in the following specific examples. However, the present invention is not limited to such examples.

General Procedure for Preparing a Resin Blend and Samples for Testing

A neutral solvent, acetone, is employed to facilitate homogeneous mixing of a block copolymer, a brominated epoxy, and a curing agent at room temperature (about 25° C.), typically adding 23 mL of acetone to a 40 gram batch of resin containing 1 to 2 grams of block copolymer. Once complete homogeneity is achieved (this requires several minutes to several days), the solvent is removed under vacuum at 50° C. for one hour, followed by additional drying of the homogeneous resin mixture at 75° C. for one hour and then at 100° C. for 30 minutes. This procedure minimized condensation of the epoxy and alcohol groups prior to casting.

Uniform and bubble-free plaques are obtained by heating the resulting dried resin mixture to 150° C. and quickly pouring the resulting liquid into a preheated mold. After curing (in air) overnight at 150° C., the resulting casts are slowly cooled to room temperature, demolded, and subjected to a post-cure for one hour at 220° C. under vacuum. This produces a homogeneous, void-free, and fully cured epoxy plaque approximately 10 cm×8 cm×4 mm in size, which is then machined into compact tension, tensile, and three-point bend specimens.

As one illustration of the general procedure above, 17.62 grams of D.E.R. 383 is added to a 200 mL round-bottom flask. Then 5.8735 grams of D.E.R. 560 and 1.85 grams of $MMG(0.4)_{5.5}EH_{20.0}$ block copolymer are added to the flask. 21 mL of acetone is added to the mixture and the mixture is shaken until the D.E.R. 383 starts to dissolve. Then the mixture is stirred on a stir plate. When well stirred (around 1 day), 11.80 grams SD-1731 phenol novolac is added to the mixture. The resulting epoxy composition corresponds to a 3:1 ratio of the D.E.R. 383 to the D.E.R. 560 (by weight) cured with a stoichiometric amount of SD-1731 phenol novolac for the epoxy and epoxy groups in the block copolymer. This blend is stirred an additional 2 days until all the components are completely dissolved. The acetone solvent is removed on a vacuum line to make a clear cast using a 24/40 connector to hook the round bottom flask to the line.

The acetone is removed in a series of stages to minimize exposure of the blend to temperature and foaming. First, the acetone is slowly removed at room temperature for an hour. Then the mixture is heated to 50° C. using an oil bath with temperature control and held at 50° C. for one hour. Next, the temperature is increased to 75° C. and held for one hour. Then the mixture is heated to 100° C. and held for 30 minutes. The oil bath is then set to 150° C. and as the oil bath is heating, the sample is removed from the vacuum line at a temperature around 140° C. (15 minutes later) and then poured quickly into a preheated (150° C.) mold.

The mold is placed in a 150° C. oven and cured overnight in air. The sample is slowly cooled back to room temperature and then removed from the mold. A post-cure at 220° C. for 1 hour under vacuum is then done. The fully cured, molded sample is void-free indicating complete removal of the solvent and has dimensions of 10 cm×8 cm×0.4 cm.

The sample is then taken to the machine shop to produce compact tension, tensile, and dynamic mechanical spectroscopy samples.

General Testing Procedures (1) Dynamic mechanical spectroscopy (DMS) samples were test specimen bars machined to 28 mm long×6 mm wide×2 mm thick. Modified and unmodified samples were tested in a three-point bend configuration in a Rheometrics Scientific Mark IV Dynamic Mechanical Testing Apparatus (DMTA). At least two, but typically five, DMS samples of each material were tested. A test on a steel bar was always performed first to ascertain whether the rheometer needed calibration.

The DMS samples were subjected to a sinusoidal deformation to measure the dynamic elastic (E') and loss (E") flexure moduli at a fixed frequency of 10 rad/s and strain of 0.01% while increasing the temperature at 2° C./minute from 25° C. to 185° C. The $T_g$ was identified as the temperature where the elastic modulus drops precipitously, corresponding to a peak in the tan δ curve where δ=E"/E'. The room temperature flexural modulus, E', and glass transition temperature, $T_g$, were recorded for each sample. The modulus decreased up to 50% (around 1.5 GPa) depending on which block copolymer was used. An increase in $T_g$ ranged from 30° C. to 50° C. depending on the block copolymer.

(2) Void-free samples for compact tension (CT) fracture tests were machined from an epoxy sheet. Compact tension experiments were performed on samples that were 4 mm thick to ensure plane strain testing conditions. The critical plane strain fracture 1 toughness, $K_{Ic}$, for the block copolymer modified epoxy material was determined using the compact tension geometry method described in ASTM D5045. The samples were precracked using a fresh razor blade tapped into the notch end. Cracks were initiated by lightly tapping a new, liquid nitrogen chilled razor blade in the machined notch. Typically, these samples were difficult to precrack due to their high fracture toughness. Tests were conducted on an MTS testing frame in tensile mode with a cross-head speed of 10 mm/minute. The samples were pulled apart in tension at a rate of 10 mm/minute and the peak load was recorded. Six to ten samples were tested for each material. From the peak load and the sample dimensions, the critical stress intensity factor was calculated and then the strain energy release rate was calculated using linear elastic fracture mechanics.

The fracture toughness for each sample was calculated using the following equation:

$$K_{1c} = \frac{P_{\max}}{BW^{1/2}} f\left(\frac{a}{W}\right)$$

where $P_{max}$ is the maximum load at failure, B is the sample thickness, W is the overall length, a is the crack length and f(a/W) is an expression accounting for the geometry of the sample identified in ASTM D5045.

The strain energy release rate, $G_c$, was calculated from $K_{Ic}$ using the following equation:

$$G_c = \frac{K_{1c}^2}{E}(1 - V^2) \text{ (plane strain)}$$

where v is Poisson's ratio, taken to be 0.34, and E is the Young's modulus. Young's modulus was measured on the same MTS frame at the same cross-head speed used for the compact tension experiments.

Typical strain energy release rates increased from 50 J/m² to 450 J/m² to 1650 J/m².

(3) The morphologies of block copolymer modified epoxy composites were determined by transmission electron microscopy (TEM). TEM was performed on a representative piece of cured material to determine the morphology. A representative piece of the epoxy sheet was microtomed at room temperature using a Reichert Ultra-microtome S equipped with a diamond knife. TEM samples were prepared using the Reichert Ultra-microtome S at a speed of 1.0 mm/s using a diamond knife to cut samples around 70 nm thick. The thin (ca 70 nm) sections were floated on water, recovered on copper grids, and stained with the vapors of a 0.5 wt % aqueous solution of $RuO_4$. The samples were placed on a 400 mesh copper grid and stained in the vapors of a 0.5 weight % $RuO_4$ aqueous solution for 20 minutes.

For the PEP-PEO blends, $RuO_4$ preferentially stains in the following order: PEO>epoxy>PEP; for the methacrylic based block copolymers, $RuO_4$ stains in the following order: MMG(x)>epoxy>EH. While PMMA does not absorb the $RuO_4$ stain, the stain apparently penetrates the epoxy around the PMMA to a greater degree than the bulk epoxy. In addition, any unreacted glycidyl groups in the epoxy miscible block will also react with $RuO_4$ and this combination of effects gives the appearance that the MMG(x) is stained black. The staining time with $RuO_4$ for either type of block copolymer was 20 minutes.

The stained samples were then imaged with a JEOL 1210 TEM at an accelerating voltage of 120 kV. These samples had a worm-like micelle morphology with diameter of 10 nm and aspect ratios of around 20:1.

EXAMPLE 1

Two grams of PEO-PEP block copolymer ($f_{PEO}$=0.25, $M_n$=8,000 g/mole, $M_w/M_n$=1.04) were added to 24.00 grams D.E.R. 383 in a round bottom flask. 23 mL of acetone was added to the flask and the contents were stirred until the block copolymer was completely dissolved (approximately two weeks). Then 14.00 grams of phenol novolac were added to the flask and the contents of the flask stirred until the phenol novolac dissolved. The flask was attached to a vacuum line using a 24/40 connector. The acetone solvent was slowly removed at room temperature until any resultant foaming subsided (thirty minutes). An oil bath was placed around the flask and a temperature was set to 50° C. The solvent was removed for 1 hour at 50° C. and then the temperature was increased to 75° C. (1 hour), and then to 100° C. (thirty minutes). The oil bath temperature was set to 150° C. and, after waiting for 10 minutes, the flask was disconnected from the vacuum line. The epoxy and block copolymer blend was poured into a 4 mm thick rectangular mold (preheated to 150° C.) coated with Sprayon Dry Film P.T.F.E. mold release spray. The mold was cured at 150° C. overnight in air. After the oven was turned off, the resultant sample was cooled to room temperature. The sample was removed from mold and the blend was post-cured at 220° C. for one hour under vacuum. After the oven was turned off, the cured sample was cooled slowly to room temperature. The resultant cured sample was machined into compact tension, tensile, and three point bend samples.

The compact tension tests were performed using a 10 mm/minute test speed with precracks initiated by liquid nitrogen chilled razor blade (new) on a 4 mm thick sample. Tensile tests were performed using a 10 mm/minute test speed. Three point bend tests were performed on a Rheometrics Scientific Mark IV Dynamic Mechanical Testing Apparatus on 28 mm long, 6 mm wide and 2 mm thick samples at 0.01% strain and 10 rad/s. Temperature was increased by 2° C./minute from room temperature to 185° C. while the elastic flexural storage and loss moduli were measured. Results for this sample: $K_{Ic}$=1.62 ±0.07 MPa m$^{0.5}$, E=2.4±0.1 GPa, $T_g$=154° C., $G_c$=967±23 J/m².

EXAMPLE 2

Two grams of PEO-PEP block copolymer ($f_{PEO}$=0.25, $M_n$=8,000 g/mole, $M_w/M_n$=1.04) were added to 23 mL acetone and stirred until the polymer was dissolved (two days). 24.00 Grams D.E.R. 383 were added to the flask and the contents of the flask stirred until dissolved (one to two days). Then 14.00 grams of phenol novolac were added and stirred until dissolved. The flask was attached to a vacuum line using a 24/40 connector and the solvent was slowly removed at room temperature until any resultant foaming subsided (thirty minutes). An oil bath was placed around the flask and the temperature was set to 50° C. The solvent was removed for 1 hour at 50° C. and then the temperature was increased to 75° C. (1 hour), and then to 100° C. (thirty minutes). The oil bath temperature was set to 150° C. and, after waiting 10 minutes, the flask was disconnected from the vacuum line. The epoxy and block copolymer blend was poured into a 4 mm thick rectangular mold (preheated to 150° C.) coated with Sprayon Dry Film P.T.F.E. mold release spray. The mold was cured at 150° C. overnight in air. After the oven was turned off, the resultant sample was cooled to room temperature. The sample was removed from the mold and the blend was post-cured at 220° C. for one hour under vacuum. After the oven was turned off, the cured sample was cooled slowly to room temperature. The resultant cured sample was machined into compact tension, tensile, and three point bend samples.

The compact tension tests were performed using a 10 mm/minute test speed with precracks initiated by liquid nitrogen chilled razor blade (new) on a 4 mm thick sample. Tensile tests were performed using a 10 mm/minute test speed. Three point bend tests were performed on a Rheometrics Scientific Mark IV Dynamic Mechanical Testing Apparatus on 28 mm long, 6 mm wide and 2 mm thick samples at 0.01% strain and 10 rad/s. Temperature was increased by 2° C./minute from room temperature to 185° C. while the elastic flexural storage and loss moduli were measured. Results for this sample: $K_{Ic}$=1.64 ±0.06 MPa m$^{0.5}$, E=2.96±0.35 GPa, $T_g$=152° C., $G_c$=803±47 J/m².

EXAMPLE 3

Two grams of PEO-PEP block copolymer $f_{PEO}$=0.25, $M_n$=8,000 g/mole, $M_w/M_n$=1.04) were added to 19.05 grams D.E.R. 383 and 6.35 grams D.E.R. 560 in a round bottom flask. 23 mL acetone was added to the flask and the contents of the flask stirred until the block copolymer was completely dissolved (approximately two weeks). Then 12.6 grams of phenol novolac were added and stirred until dissolved. The flask was attached to a vacuum line using a 24/40 connector and the solvent was slowly removed at room temperature until the resultant foaming subsided (thirty minutes). An oil bath was placed around the flask and the temperature was set to 50° C. The solvent was removed for 1 hour at 50° C. and then the temperature was increased to 75° C. (1 hour), and then to 100° C. (thirty minutes). The oil bath temperature was set to 150° C. and, after waiting for 10 minutes, the flask was disconnected from the vacuum line. The epoxy and block copolymer blend was poured into 4 mm thick rectangular mold (preheated to 150° C.) coated with Sprayon Dry Film P.T.F.E. mold release spray. The mold was cured at 150° C. overnight in air. After the oven was turned off, the resultant sample was cooled to room temperature. The sample was removed from the mold and the blend was post-cured at 220° C. for one hour under vacuum. After the oven was turned off, the cured sample was cooled slowly to room temperature. The resultant cured sample was machined into compact tension, tensile, and three point bend samples.

The compact tension tests were performed using a 10 mm/minute test speed with precracks initiated by liquid nitrogen chilled razor blade (new) on a 4 mm thick sample. Tensile tests were performed using a 10 mm/minute test speed. Three point bend tests were performed on a Rheometrics Scientific Mark IV Dynamic Mechanical Testing Apparatus on 28 mm long, 6 mm wide and 2 mm thick samples at 0.01% strain and 10 rad/s. Temperature was increased by 2° C./minute from room temperature to 185° C. while the elastic flexural storage and loss moduli were measured. Results for this sample: $K_{Ic}$=1.72 ±0.15 MPa $m^{0.5}$, E=2.37±0.16 GPa, $T_g$=155° C., $G_c$=1101±47 J/m².

EXAMPLE 4

Two grams of PEO-PEP block copolymer ($f_{PEO}$=0.25, $M_n$=8,000 g/mole, $M_w/M_n$=1.04) were added to 23 mL acetone and stirred until the polymer was dissolved (two days). 19.05 Grains D.E.R. 383 and 6.35 grams D.E.R. 560 were added to the flask and the contents of the flask stirred until dissolved (one to two days). Then 12.6 grams of phenol novolac were added and stirred until dissolved. The flask was attached to a vacuum line using a 24/40 connector and the solvent was slowly removed at room temperature until the resultant foaming subsided (thirty minutes). An oil bath was placed around the flask and the temperature was set to 50° C. The solvent was removed for 1 hour at 50° C. and the temperature was increased to 75° C. (1 hour), and then to 100° C. (thirty minutes). An oil bath was placed around the flask and a temperature was set to 150° C. and after waiting 10 minutes the flask was disconnected from the vacuum line. The epoxy and block copolymer blend was poured into a 4 mm thick rectangular mold (preheated to 150° C.) coated with Sprayon Dry Film P.T.F.E. mold release spray. The mold was cured at 150° C. overnight in air. After the oven was turned off, the resultant sample was cooled to room temperature. The sample was removed from the mold and the blend was post-cured at 220° C. for one hour under vacuum. After the oven was turned off, the cured sample was cooled slowly to room temperature. The resultant cured sample was machined into compact tension, tensile, and three point bend samples.

The compact tension tests were performed using a 10 nun/minute test speed with precracks initiated by liquid nitrogen chilled razor blade (new) on a 4 mm thick sample. Tensile tests were performed using a 10 mm/minute test speed. Three point bend tests were performed on a Rheometrics Scientific Mark IV Dynamic Mechanical Testing Apparatus on 28 mm long, 6 mm wide and 2 mm thick samples at 0.01% strain and 10 rad/s. Temperature was increased by 2° C./minute from room temperature to 185° C. while the elastic flexural storage and loss moduli were measured. Results for this sample: $K_{Ic}$=1.75 ±0.05 MPa $m^{0.5}$, E=2.84±0.2 GPa, $T_g$=153° C., $G_c$=955±31 J/m².

EXAMPLE 5

Two grams of PEO-PEP block copolymer ($f_{PEO}$=0.25, $M_n$=8,000 g/mole, $M_w/M_n$=1.04) were added to 13.5 grams D.E.R. 383 and 13.5 grams D.E.R. 560 in a round bottom flask. 23 mL acetone was added to the flask and the contents of the flask stirred until the block copolymer was completely dissolved (approximately two weeks). Then 11.0 grams of phenol novolac were added and stirred until dissolved. The flask was attached to a vacuum line using a 24/40 connector and the solvent was slowly removed at room temperature until any resultant foaming subsided (thirty minutes). An oil bath was placed around the flask and the temperature was set to 50° C. The solvent was removed for 1 hour at 50° C. and then the temperature was increased to 75(C (1 hour), and then to 100° C. (thirty minutes). The oil bath temperature was set to 150° C. and after waiting 10 minutes the flask was disconnected from the vacuum line. The epoxy and block copolymer blend was poured into a 4 mm thick rectangular mold (preheated to 150° C.) coated with Sprayon Dry Film P.T.F.E. mold release spray. The mold was cured at 150° C. overnight in air. After the oven was turned off, the resultant sample was cooled to room temperature. The sample was removed from the mold and the blend was post-cured at 220° C. for one hour under vacuum. After the oven was turned off, the cured sample was cooled slowly to room temperature. The resultant cured sample was machined into compact tension, tensile, and three point bend samples.

The compact tension tests were performed using a 10 mm/minute test speed with precracks initiated by liquid nitrogen chilled razor blade (new) on a 4 mm thick sample. Tensile tests were performed using a 10 mm/minute test speed. Three point bend tests were performed on a Rheometrics Scientific Mark IV Dynamic Mechanical Testing Apparatus on 28 mm long, 6 mm wide and 2 mm thick samples at 0.01% strain and 10 rad/s. The temperature was increased by 2° C./minute from room temperature to 185° C. while the elastic flexural storage and loss moduli were measured. Results for this sample: $K_{Ic}$ 1.74±0.07 MPa $m^{0.5}$, E=2.85±0.13 GPa, $T_g$=156° C., $G_c$=943±27 J/m².

EXAMPLE 6

Two grams of PEO-PEP block copolymer ($f_{PEO}$=0.25, $M_n$=8,000 g/mole, $M_w/M_n$=1.04) were added to 23 mL acetone and stirred until polymer was dissolved (two days). 13.5 Grams D.E.R. 383 and 13.5 grams D.E.R. 560 were added to the flask and the contents of the flask stirred until dissolved (one to two days). Then 11.0 grams of phenol novolac were added and stirred until dissolved. The flask was attached to a vacuum line using a 24/40 connector and the solvent was slowly removed at room temperature until any resultant foaming subsided (thirty minutes). An oil bath was placed around the flask and the temperature was set to 50° C. The solvent was removed for 1 hour at 50° C. and then the temperature was increased to 75° C. (1 hour), and then to 100° C. (thirty minutes). The oil bath temperature was set to 150° C. and after waiting 10 minutes the flask was disconnected from the vacuum line. The epoxy and block copolymer blend was poured into a 4 mm thick rectangular mold (preheated to 150° C.) coated with Sprayon Dry Film P.T.F.E. mold release spray. The mold was cured at 150° C. overnight in air. After the oven was turned off, the resultant sample was cooled to room temperature. The sample was removed from the mold and the blend was post-cured at 220° C. for one hour under vacuum. After the oven was turned off, the cured sample was cooled slowly to room temperature. The resultant cured sample was machined into compact tension, tensile, and three point bend samples.

The compact tension tests were performed using 10 mm/minute test speed with precracks initiated by liquid nitrogen chilled razor blade (new) on a 4 mm thick sample. Tensile tests were performed using a 10 mm/minute test speed. Three point bend tests were performed on a Rheometrics Scientific Mark IV Dynamic Mechanical Testing Apparatus on 28 mm long, 6 mm wide and 2 mm thick samples at 0.01% strain and 10 rad/s. The temperature was increased by 2° C./minute from room temperature to 185° C. while the elastic flexural storage and loss moduli were measured. Results for this sample: $K_{Ic}=1.67\pm0.02$ MPa m$^{0.5}$, $E=2.85\pm0.11$ GPa, $T_g=155°$ C., $G_c=870\pm15$ J/m$^2$.

EXAMPLE 7

1.85 Grams of poly(methylmethacrylate-co-glycidyl methacrylate)-poly(2-ethylhexylmethacrylate) block copolymer (MMG(0.4)$_{5.5}$EH$_{20.0}$:weight fraction MMG block=0.22, mole fraction glycidyl methacrylate in MMG block=0.4, $M_n=25,500$ g/mole, $M_w/M_n=1.21$) were added to 17.62 grams D.E.R. 383 and 5.87 grams D.E.R 560 in a round bottom flask. 21 mL acetone were added to the flask and the contents of the flask stirred until block copolymer was completely dissolved (one day). Then 11.80 grams phenol novolac were added and stirred until dissolved. The flask was attached to a vacuum line using a 24/40 connector and the solvent was slowly removed at room temperature until any resultant foaming subsided (thirty minutes). An oil bath was placed around the flask and the temperature was set to 50° C. The solvent was removed for 1 hour at 50° C. and then the temperature was increased to 75° C. (1 hour), and then to 100° C. (thirty minutes). The oil bath temperature was set to 150° C. and after waiting 10 minutes the flask was disconnected from the vacuum line. The epoxy and block copolymer blend was poured into a 4 mm thick rectangular mold (preheated to 150° C.) coated with Sprayon Dry Film P.T.F.E. mold release spray. The mold was cured at 150° C. overnight in air. After the oven was turned off, the resultant sample was cooled to room temperature. The sample was removed from the mold and the blend was post-cured at 220° C. for one hour under vacuum. After the oven was turned off, the cured sample was cooled slowly to room temperature. The resultant cured sample was machined into compact tension, tensile, and three point bend samples.

The compact tension tests were performed using a 10 mm/minute test speed with precracks initiated by liquid nitrogen chilled razor blade (new) on a 4 mm thick sample. Tensile tests were performed using a 10 mm/minute test speed. Three point bend tests were performed on a Rheometrics Scientific Mark IV Dynamic Mechanical Testing Apparatus on 28 mm long, 6 mm wide and 2 mm thick samples at 0.01% strain and 10 rad/s. The temperature was increased by 2° C./min from room temperature to 185° C. while the elastic flexural storage and loss moduli were measured. Results for this sample: $K_{Ic}$ 1.16:±0.12 MPa m$^{0.5}$, $E=2.75\pm0.05$ GPa, $T_g=127°$ C., $G_c=431\pm30$ J/m$^2$.

EXAMPLE 8

Two grams of PEO-PEP block copolymer ($f_{PEO}=0.39$, $M_n=16,800$ g/mole, $M_w/M_n=1.10$) were added to 23 mL acetone and stirred until the polymer was dissolved (two days). 24.00 Grams D.E.R. 383 were added to the flask and the contents of the flask stirred until dissolved (one to two days). Then 14.00 grams phenol novolac were added and stirred until dissolved. The flask was attached to a vacuum line using a 24/40 connector and the solvent was slowly removed at room temperature until any resultant foaming subsided (thirty minutes). An oil bath was placed around the flask and the temperature was set to 50° C. The solvent was removed for 1 hour at 50° C. and then the temperature was increased to 75° C. (1 hour), and then to 100° C. (thirty minutes). The oil bath temperature was set to 150° C. and after waiting 10 minutes the flask was disconnected from the vacuum line. The epoxy and block copolymer blend was poured into a 4 mm thick rectangular mold (preheated to 150° C.) coated with Sprayon Dry Film P.T.F.E. mold release spray. The mold was cured at 150° C. overnight in air. After the oven was turned off, the resultant sample was cooled to room temperature. The sample was removed from the mold and the blend was post-cured at 220° C. for one hour under vacuum. After the oven was turned off, the cured sample was cooled slowly to room temperature. The resultant cured sample was machined into compact tension, tensile, and three point bend samples.

The compact tension tests were performed using a 10 mm/minute test speed with precracks initiated by liquid nitrogen chilled razor blade (new) on a 4 mm thick sample. Tensile tests performed using a 10 mm/minute test speed. Three point bend tests were performed on a Rheometrics Scientific Mark IV Dynamic Mechanical Testing Apparatus on 28 mm long, 6 mm wide and 2 mm thick samples at 0.01% strain and 10 rad/s. Temperature was increased by 2° C./minute from room temperature to 150° C. while the elastic flexural storage and loss moduli were measured. Results for this sample: $K_{Ic}=1.03\pm0.17$ MPa m$^{0.5}$, $E=2.56\pm0.09$ GPa, $T_g=103°$ C., $G_c=411\pm43$ J/m$^2$.

EXAMPLE 9

Two grams of PEO-PEP block copolymer ($f_{PEO}=0.39$, $M_n=16,800$ g/mole, $M_w/M_n=1.10$) were added to 23 mL acetone and stirred until polymer was dissolved (two days). 19.05 Grams D.E.R. 383 and 6.35 grams D.E.R. 560 were added to the flask and the contents of the flask stirred until dissolved (one to two days). Then 12.6 grams of phenol novolac were added and stirred until dissolved. The flask was attached to a vacuum line using a 24/40 connector and the solvent was slowly removed at room temperature until any resultant foaming subsided (thirty minutes). An oil bath was placed around the flask and the temperature was set to 50° C. The solvent was removed for 1 hour at 50° C. and then the temperature was increased to 75° C. (1 hour), and then to 100° C. (thirty minutes). The oil bath temperature was set to 150° C. and after waiting 10 minutes the flask was disconnected from the vacuum line. The epoxy and block copolymer blend was poured into a 4 mm thick rectangular mold (preheated to 150° C.) coated with Sprayon Dry Film P.T.F.E. mold release spray. The mold was cured at 150° C. overnight in air. After the oven was turned off, the resultant sample was cooled to room temperature. The sample was removed from the mold and the blend was post-cured at 220° C. for one hour under vacuum. After the oven was turned off, the cured sample was cooled slowly to room temperature. The resultant cured sample was machined into compact tension, tensile, and three point bend samples.

The compact tension tests were performed using a 10 mm/minute test speed with precracks initiated by liquid nitrogen chilled razor blade (new) on a 4 mm thick sample. Tensile tests were performed using a 10 mm/minute test speed. Three point bend tests were performed on a Rheometrics Scientific Mark IV Dynamic Mechanical Testing Apparatus on 28 mm long, 6 mm wide and 2 mm thick samples at 0.01% strain and 10 rad/s. Temperature was increased by 2° C./minute from room temperature to 150° C. while the elastic flexural storage and loss moduli were measured. Results for this sample: $K_{Ic}=1.17\pm0.20$ MPa m$^{0.5}$, $E=2.37\pm0.16$ GPa, $T_g=111°$ C., $G_c=582\pm56$ J/m$^2$.

EXAMPLE 10

Use of Block Copolymer with a Phosphorous-Containing Epoxy Resin

Two grams of PEO-PEP block copolymer ($f_{PEO}=0.25$, Mn 8,000 g/mole, $M_w/M_n=1.04$) are added to 24.00 grams of a phosphorous-containing epoxy resin, such as XZ92530 resin in a round bottom flask. 23 mL of acetone are added to the flask and the contents are stirred until the block copolymer is completely dissolved (approximately two weeks). Then 14.00 grams of phenol novolac is added to the flask and the contents of the flask are stirred until the phenol novolac dissolves. The flask is attached to a vacuum line using a 24/40 connector. The acetone solvent is slowly removed at room temperature until any resultant foaming subsided (thirty minutes). An oil bath is placed around the flask and a temperature is set to 50° C. The solvent is removed for 1 hour at 50° C. and then the temperature is increased to 75° C. (1 hour), and then to 100° C. (thirty minutes). The oil bath temperature is set to 150° C. and after waiting for 10 minutes the flask is disconnected from the vacuum line. The epoxy and block copolymer blend are poured into a 4 mm thick rectangular mold (preheated to 150° C.) coated with Sprayon Dry Film P.T.F.E. mold release spray. The mold is cured at 150° C. overnight in air. After the oven is turned off, the resultant sample is cooled to room temperature. The sample is removed from mold and the blend is post-cured at 220° C. for one hour under vacuum. After the oven is turned off, the cured sample is cooled slowly to room temperature. The resultant cured sample is machined into compact tension, tensile, and three point bend samples.

The compact tension tests are performed using a 10 mm/minute test speed with precracks initiated by liquid nitrogen chilled razor blade (new) on a 4 mm thick sample. Tensile tests are performed using a 10 mm/minute test speed. Three point bend tests are performed on a Rheometrics Scientific Mark IV Dynamic Mechanical Testing Apparatus on 28 mm long, 6 mm wide and 2 mm thick samples at 0.01% strain and 10 rad/s. The temperature is increased by 2° C./minute from room temperature to 185° C. while the elastic flexural storage and loss moduli are measured.

What is claimed is:

1. A curable flame retardant epoxy resin composition with increased toughness comprising:
   (a) at least one curable flame retardant epoxy resin;
   (b) an amphiphilic block copolymer in an amount such that said amphiphilic block copolymer self assembles into micellar morphologies and such that the fracture resistance of the resulting cured product increases; and
   (c) a curing agent.

2. The curable composition of claim 1 wherein the flame retardant epoxy resin is a brominated epoxy resin.

3. The curable resin composition of claim 2 wherein the brominated epoxy is tetrabromobisphenol A diglycidyl ether.

4. The curable composition of claim 1 wherein the flame retardant epoxy resin is a phosphorous-containing epoxy resin.

5. The curable composition of claim 1 wherein the block copolymer is present in an amount such that, upon mixing in the un-cured state, the block copolymer self-assembles into a worm-like micelle morphology; such that the morphology persists through the curing of the composition; and such that the fracture resistance of the resulting cured product increases.

6. The curable composition of claim 1 wherein the block copolymer is present in an amount such that, upon mixing in the un-cured state, the block copolymer self-assembles into a spherical micelle morphology; such that the morphology persists through the curing of the composition; and such that the fracture resistance of the resulting cured product increases.

7. The curable composition of claim 1 wherein the block copolymer is a diblock copolymer.

8. The curable composition of claim 1 wherein the block copolymer is poly(ethylene oxide)-poly(ethylene-alt-propylene) (PEO-PEP).

9. The curable composition of claim 1 wherein the block copolymer is poly(methyl methacrylate-ran-glycidyl methacrylate)-poly(2-ethylhexyl methacrylate) (P(MMA-ran-GMA)-PEHMA).

10. The curable composition of claim 1 wherein the amount of block copolymer is from about 0.1 weight percent to about 30 weight percent.

11. The curable composition of claim 1 wherein the epoxy resin is dygliciyl ether of bisphenol A.

12. The curable composition of claim 1 wherein the curing agent is a phenol novolac.

13. The curable composition of claim 1 including a solvent.

14. The curable resin composition of claim 1 including a catalytic amount of a catalyst for accelerating the reaction of the flame retardant epoxy resin with the curing agent.

15. The curable resin composition of claim 14, wherein the catalyst is an imidazole.

16. A fiber reinforced composite article comprising a matrix including a curable epoxy resin composition according to claim 1.

17. The fiber reinforced composite article of claim 16, which is a laminate or a prepreg for an electric circuit.

18. An electric circuit component having an insulating coating of the epoxy resin composition according to claim 1.

19. A process of producing a coated article, comprising coating an article with a curable epoxy resin according to claim 1, and heating the coated article to cure the epoxy resin.

20. A prepreg comprising:
   (a) a woven fabric, and
   (b) a curable epoxy resin composition of claim 1.

21. A laminate comprising:
   (a) a substrate including a resin composition of an epoxy resin of claim 1; and
   (b) a layer of metal disposed on at least one surface of said substrate.

22. The laminate of claim 21 wherein the substrate further comprises a reinforcement of a woven glass fabric, wherein the epoxy resin composition is impregnated on the woven glass fabric.

23. A printed wiring board (PWB) made of the laminate of claim 22.

24. A process for preparing a curable resin composition comprising mixing:
   (a) at least one curable flame retardant epoxy resin;
   (b) an amphiphilic block copolymer in an amount such that said amphiphilic block copolymer self assembles into micellar morphologies and such that the fracture resistance of the resulting cured product increases; and
   (c) a curing agent.

25. A cured resin product comprising a flame retardant epoxy resin containing a block copolymer self-assembled into a worm-like micelle morphology.

26. A process for preparing a cured resin product comprising heating a mixture of:
   (a) at least one curable flame retardant epoxy resin;
   (b) an amphiphilic block copolymer in an amount such that said amphiphilic block copolymer self assembles into micellar morphologies and such that the fracture resistance of the resulting cured product increases; and
   (c) a curing agent.

* * * * *